United States Patent [19]

Stearns

[11] 4,284,468

[45] Aug. 18, 1981

[54] PATTERNED CHEMICAL ETCHING OF HIGH TEMPERATURE RESISTANT METALS

[76] Inventor: Llewelyn Stearns, 142 Nevada St., El Segundo, Calif. 90245

[21] Appl. No.: 61,496

[22] Filed: Jul. 27, 1979

Related U.S. Application Data

[63] Continuation of Ser. No. 861,165, Dec. 16, 1977, abandoned.

[51] Int. Cl.³ .................................................. C23F 1/02
[52] U.S. Cl. .................................. 156/661.1; 156/644; 156/652; 156/656; 156/668; 252/79.3; 430/323
[58] Field of Search ............................ 252/79.3, 79.2; 156/644, 630, 652, 632, 655, 633, 656, 634, 659.1, 660, 661.1, 664, 668; 430/308, 313, 314, 316, 317, 318, 323, 329, 312; 101/128.3, 128.2, 128.4

[56] References Cited

U.S. PATENT DOCUMENTS

| 3,202,094 | 8/1965 | Smallman | 101/128.2 |
| 3,447,924 | 6/1969 | Trzyna et al. | 156/644 UX |
| 4,155,801 | 5/1979 | Provancher | 156/644 X |

FOREIGN PATENT DOCUMENTS

7116101  6/1972  Netherlands .............................. 156/902

OTHER PUBLICATIONS

IBM Technical Disclosure Bulletin, vol. 11, No. 8, Jan. 1969, p. 896, Altering Circuit Connections by R. R. Rodite.

Production Technology, Apr. 1963, pp. 34–37, Chemical Contouring by Langstone et al.

*Primary Examiner*—William A. Powell
*Attorney, Agent, or Firm*—I. Morley Drucker

[57] ABSTRACT

An improved process for providing a design within a metallic surface by composite photoresist techniques in which the composite photoresist has sufficient chemical resistance to permit etching the design, with an aqua-regia or aqua-regia fluoride system in the most commercially available corrosion resistant and high temperature resistant alloys and metals. The process consists in applying a first coating of epoxy resin or other resin to the metal substrate or surface to be etched; subsequently applying a conventional photoresist material upon the cured resin; applying a photomask to said photoresist in a desired pattern; exposing the photomask to a light source to actuate the photoresist; chemically removing the photoresist in the non-activated areas; subsequently removing the epoxy or other resin underlying the non-activated areas preferably by means of a concentrated solution of sulfuric acid, which dissolves the resin but does not attack the photoresist and thereby exposing the metallic substrate in the same pattern as that developed upon the photoresist, and subsequently etching the metal by means of a mixture of acids capable of reacting with the metallic surface under the reaction conditions chosen, but not with the resin layer.

8 Claims, 11 Drawing Figures

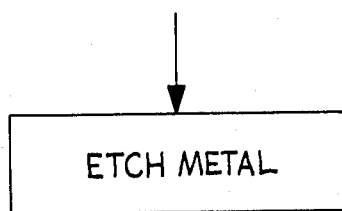
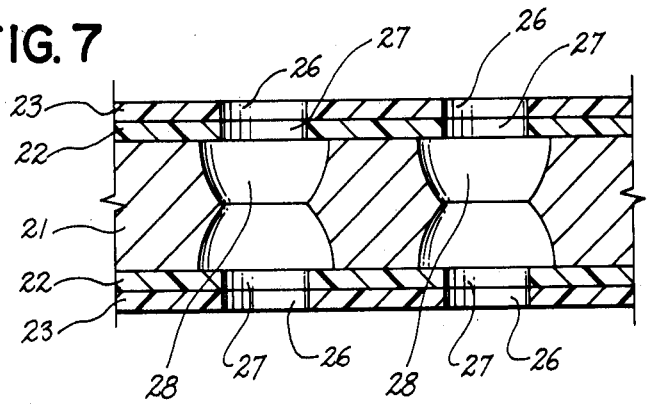
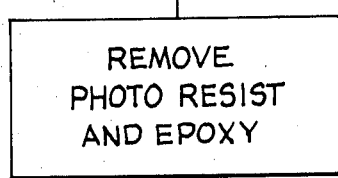
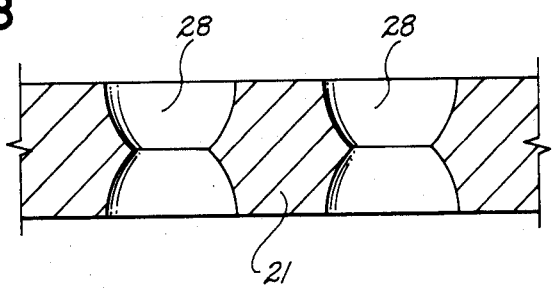
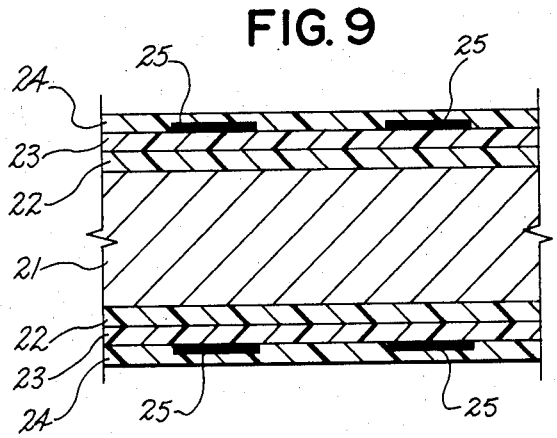
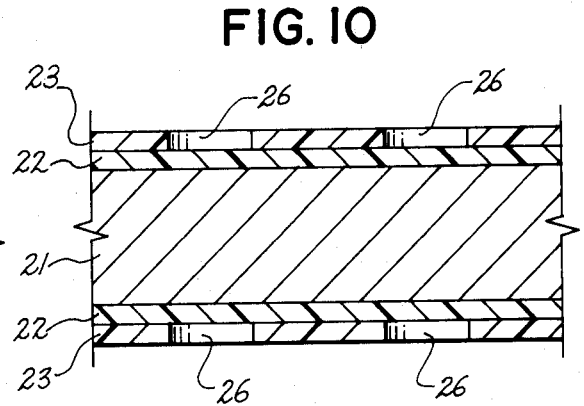
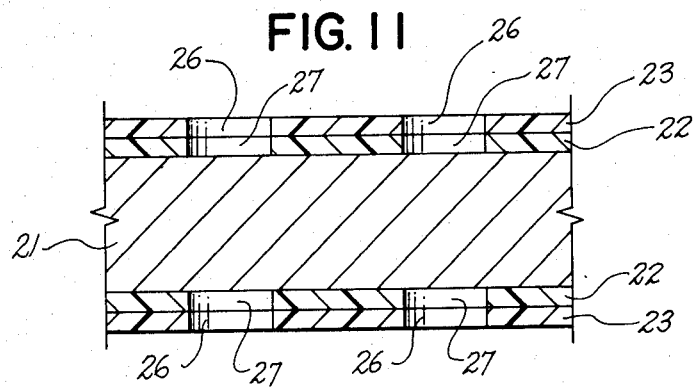

PATTERNED CHEMICAL ETCHING OF HIGH TEMPERATURE RESISTANT METALS

CROSS-REFERENCE TO RELATED APPLICATIONS

This application is a continuation application of pending application Ser. No. 861,165 filed Dec. 16, 1977, now abandoned and entitled: CHEMICAL ETCHING OF HIGH TEMPERATURE RESISTANT METALS.

BACKGROUND OF THE INVENTION

In the past decade, the environmental impact of the jet engine as employed in modern aircraft has been so severe as to require special legislation to require modification on both the state and federal level. The environmental problems consist of two extreme conditions, namely noise and air pollution. Through extensive research, it has been found that modifying the surface structure of the foil through which the air passes by incorporating a repetitive hole pattern in the skin would enhance the air flow to provide better combustion, thereby reducing or eliminating the visible air pollution; especially as important, such a structure would muffle the sound of the jet engine, thereby reducing the noise to an acceptable level.

It is the principle of the jet engine that cold air is taken in one end, compressed, mixed with fuel and burned, thereby expanding the ignition products and air which provides the thrust. It is quite obvious that the entire stream of gases must be confined by a structure to produce the thrust backward, which thrust provides the propulsion for the aircraft. It is the containment walls or screens with which this invention is concerned.

It is apparent that as the gases enter the engine, they are cold, and as they enter the compressor section, they begin to warm-up from the compression and after ignition they become very hot, of the nature of 2,000° F. and higher. As the materials of the retaining walls must withstand the great change in temperature and chemical composition of the gases to which it is exposed, it has been found to be sound engineering practice to meet the various environmental changes within the engine by selecting different material capable of withstanding the environment. For instance, in the cool section of the intake, aluminum is most frequently used; as the temperature increases above 250° F., it is generally acceptable to employ 18 Cr-8 Ni steels up to a temperature of 700°-800° F.; above this temperature, it is necessary to fabricate the structure from the Chrome-Nickel or Chrome-Nickel-Molybdenum super alloy types such as Inconel 625, Hastelloy B, Hayes Alloy 25, Waspalloy, or the like. The compositions of these super alloys is as follows:

|  | Cr | Ni | Mo | Co | Fe | Nb | Tl | W |
|---|---|---|---|---|---|---|---|---|
| Inconel 625 | 21.5 | 61.0 | 9.0 | — | 2.5 | 3.6 | | |
| Hastelloy B | 1.0 | 57.8 | 30. | | 2.5 | 6.0 | | |
| Haynes Alloy 25 | 20.0 | 10.0 | | 53.5 | | | | 15.0 |
| Waspalloy | 19.5 | 55.1 | 4.3 | 13.5 | 2.0 | | | |
| Rene 41 | 19.0 | 56.9 | 10.0 | 11.0 | | | 3.1 | |

As the iron content of the alloy decreases, the corrosion resistance and high-temperature strength increase but with the increase in these desirable characteristics comes a decrease in workability. In other words, it becomes more and more difficult to find economically acceptable techniques to perform the machining and forming function necessary to provide a useful structure.

As an example of such a desirable structure for reduction of noise, a hole pattern of 0.030" diameter holes on 0.100" centers may be required. In the cold section and even the intermediate temperature section of the jet engine, such a structure may be manufactured by punching holes in a skin of aluminum or 18-8 stainless steel employing a gang punch which will produce a row of holes across an entire 48" wide skin. Staggered patterns require 2 rows of punches, that is 480 holes, with one hit of the punch. This operation is a standard manufacturing technique and has been found economically acceptable. However, where the process was applied to punching the high temperature resistant super-alloys found in the hot section, it was found that the punches would not physically withstand the high hardness of the super alloys.

It is a characteristic of the super alloys to become extremely hard as they are physically deformed. Therefore, even though the sheet of material of super alloy composition would appear to be relatively soft in the annealed state, as soon as the punch struck the metal it would begin to harden. Initially, the punch would perforate the metal but as soon as it became slightly dull, the metal would harden beneath the punch and break. If a punch broke, and was not immediately repaired, the entire pattern would be disrupted, thereby reducing the effectiveness of the panel.

Drilling was out of the question because of the expense of producing only one or a small number of holes at a time, and the work-hardening characteristics of the super-alloy is even more apparent in a machining operation, causing extensive drill breakage. Therefore, there was no known method for producing holes in the super alloy other than photo-etching.

Methods of etching the super-alloys have been known for a number of years but because of the extreme chemical resistance of the alloys, only one etching composition is known to be effective, that is an aqua-regia-fluoride acid bath of which a characteristic composition is as follows:

|  | At 140-160° F. |
|---|---|
| 32° Baume Muriatic Acid | 9 Gal. |
| 40° Baume Nitric Acid | 1 Gal. |
| 70% Hydrofluoric Acid | .2 Gal. |
| Anhydrous $FeCl_3$ to specific gravity | 1.26 |

This acid composition is extremely active. It has been found that synthetic rubber based compositions are effective resists to this composition for a limited time, and are useful in the chemical milling of the super-alloys using hand scribing techniques (see U.S. Pat. No. 2,739,047) but this method of masking is not acceptable for production of 0.030" holes necessary for screen manufacturing.

The only possible technique for masking is the art of photomasking as employed in the printed circuit field. However, there is no known photomask with sufficient chemical resistance to withstand the above described etching solution. It is in this area that applicant has discovered a process which is acceptable for etching holes in the super alloys with the accuracy of punching or photomasking, to produce a super-alloy screen by an economically feasible method.

SUMMARY DESCRIPTION OF THE INVENTION

The invention consists of the application of a dual system of organic coatings to a metallic surface which coatings provide a barrier to a very aggressive acid etching system which is chemically capable of dissolution of the most generally used high temperature resistant-alloys of the chrome-nickel complex such as Rene 41, Hastelloy B, Haynes Alloys 25 and Waspalloy to name a few.

The unique character of the dual coating system consists, first, of the application of a layer of an epoxy resin to the metallic surface to be etched. Since the epoxy layer cannot be applied in a desired pattern with the precision required to produce the accurate hole pattern necessary for the jet engine noise and fume suppression, the applicant's technique utilizes the resistance and adhesion offered by the epoxy or like resin systems with an overlying coating of photoresist material to achieve an accuracy of design capable in the printed circuit field. First, the desired pattern is developed in the photoresist layer employing conventional techniques and subsequently the pattern is reproduced in the epoxy layer using a unique acid system which will dissolve or remove epoxy resin but will not significantly affect either the photoresist material or the metallic substrate. Thereafter, the metallic substrate may be etched with an aqua-regia-fluoride acid, in the desired pattern as it is protected by the epoxy layer or the like.

BRIEF DESCRIPTION OF THE DRAWINGS

The invention will be more readily understood by reference to the attached drawings in which the following representation are made:

FIG. 7 is a representation of the coated metal which has holes etched entirely through the metal;

FIG. 8 shows the metal with the holes in the desired configuration;

FIG. 9 is a section through FIG. 4 to show the application of the photomask to the coated metal surface;

FIG. 10 is a section of FIG. 5 in which the photoresist has been developed to expose the epoxy beneath in the hole area only; and FIG. 11 is a section of FIG. 6 showing both the photoresist and the epoxy resin developed to expose the supper-alloy surface in the hole area ready for etching.

DETAILED DESCRIPTION OF THE INVENTION

Figure 1:
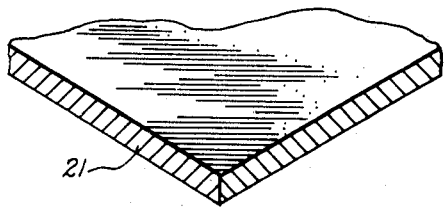
FIG. 1 shows a section of super-alloy blank.

In FIG. 1, a piece of metal 21 of the type subsequently more clearly defined, is shown. Generally, such a piece of metal is of the size of a few square inches, up to dimension of 4 feet by 8 feet, and even larger and having a thickness of the order of 0.010 inch to 0.100 inches, and although thicker material may be amenable to applicant's process, they are generally not employed.

Figure 2:
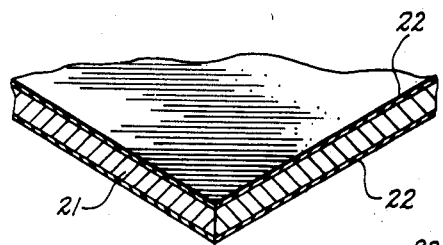
FIG. 2 represents the section of FIG. 1 to which a thin coating of epoxy resin has been applied.

In FIG. 2, the metal 21 of FIG. 1, which has been meticulously cleaned to present a water break-free surface, is coated with a liquid epoxy resin system 22 (which has been activated). The specific nature of the epoxy employed will be subsequently discussed more fully. The epoxy 22 may be applied by spray, dip-coating, roller coating or centrifugally. The method of application is conventional but the thickness of the coating must be uniform. The coating thickness preferred is of the order of 0.15 to 10 milli-inches, although slightly thinner or somewhat thicker coatings may be desirable, depending upon the thickness of the metal to be etched. The thinner coatings will give more accurate definition but will not present adequate protection for prolonged exposure in the acid etching bath.

The epoxy coating 22 is then cured, generally in an oven to provide resistance to dissolution in the photoresist and the photoresist developer, both of which have very active solvents capable of dissolving the epoxy resin if it is in the uncured state. In the first instance, if the solvents in the photoresist dissolve the epoxy, the photoresist resin will commingle with the epoxy and will not develop a precise pattern; and in the second, if the epoxy is dissolved in part by the photoresist developer, the epoxy will be dissolved in a poorly defined pattern, which will not develop correctly in the epoxy developer. The epoxy is generally cured for about one hour at 325° F., although this schedule may be varied, depending upon the thickness and the amount of activator used in the epoxy, as well as the characteristics of the epoxy resin employed. If sufficient time is available, in fact, the epoxy resin may be cured at room temperature, but this is not the case generally, in most manufacturing processes.

Figure 3:
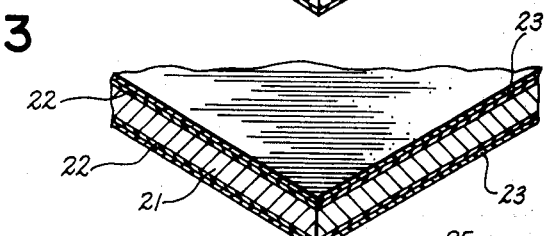
FIG. 3 is the section of metal coating with cured epoxy resin which has subsequently been coated with a photoresist.
Figure 4:
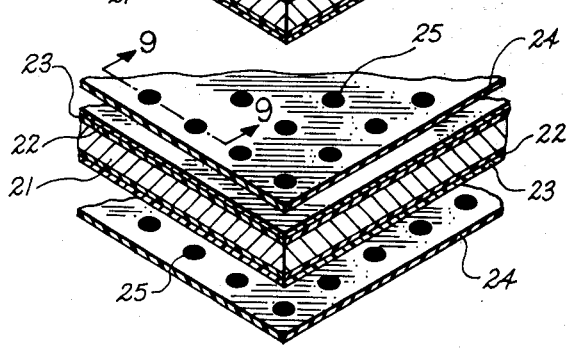
FIG. 4 is a representation of the technique of applying a photomask to both sides of the coated metal section to provide the desired pattern.

In FIG. 3, a coating of a photoresist 23 is applied to both sides of the epoxy coated metal. The photoresist 23 which I have found most acceptable is an ultra-violet light-sensitive organic polymerizable plastic composition, e.g., Phillip A. Hunt Chemical Co. 450; Dynachem CMR 5000 may also be used. These are proprietary products whose names are well known in the photo-etching art but their exact chemical compositions are unknown to the applicant.

As the photoresists specifically mentioned are solvent resin systems, it is necessary to remove the solvent prior to development. This is accomplished by a moderate bake in a well ventilated over at a temperature of 120°–200° F. for a period of 1 to ½ hour.

After the photoresist 23 is cured, in a conventional curing cycle, e.g., it is ready for printing to produce the desired pattern in the photoresist. Printing is the term used to describe the application of the photomask to the work piece. The working negative or photomask has the desired pattern in opaque black contained on a clear dimensionally stable, plastic base. The photomask 24 is applied by conventional vacuum printing techniques, to both surfaces of the coated metal; two coordinated photomasks are used at the same time so that the patterns, which are exactly the same on both sides, are precisely located in relationship to one another. It is to be noted that for purposes of this invention, it is not necessary to expose both sides of the coated metal workpiece, as the invention will be as effective from either one side or both sides, but by exposing both sides, the etching time is less than one-half and the normal taper in the hole is reduced.

After the photomask 24 has been applied to the surface of the coated metal, the package is exposed to activating radiation for the photoresist, which may be ultra-violet or any source of radiation recommended by the manufacturer of the specific photoresist.

Figure 5:
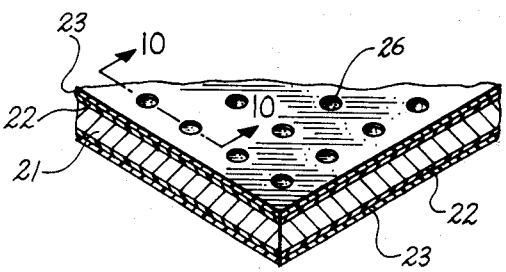
FIG. 5 depicts the metal with the photoresist developed by removal of the photoresist from the holes which have not been exposed.

After exposure to the activating radiation, the coated metal is removed from the radiation source, the photomask is removed and the photoresist is developed much as a pictoral photo is developed but using a solvent such as Xylene, which will selectively remove the unactivated photoresist material which has been protected from the activating radiation by the opaque black design. FIG. 5 represents the coated metal with the photoresist 23 developed to remove the material in the holes 26 which were protected by the opaque spots 25 in the photomask 24.

This process is more clearly shown in the section of FIG. 9 which demonstrates the application of the photomask 24 having an opaque spot 25 over the photoresist 23. In FIG. 10, the sensitized photoresist 23 has been developed to remove the photoresist, leaving holes 26 in which the surface of the epoxy resin 22 is exposed.

Figure 6:
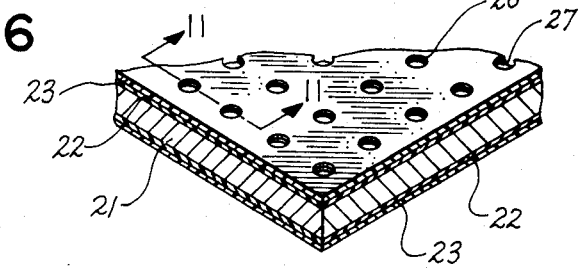
FIG. 6 represents the coated metal with both the photoresist and the epoxy resin developed with the hole pattern of the photomask.
Figure 6:
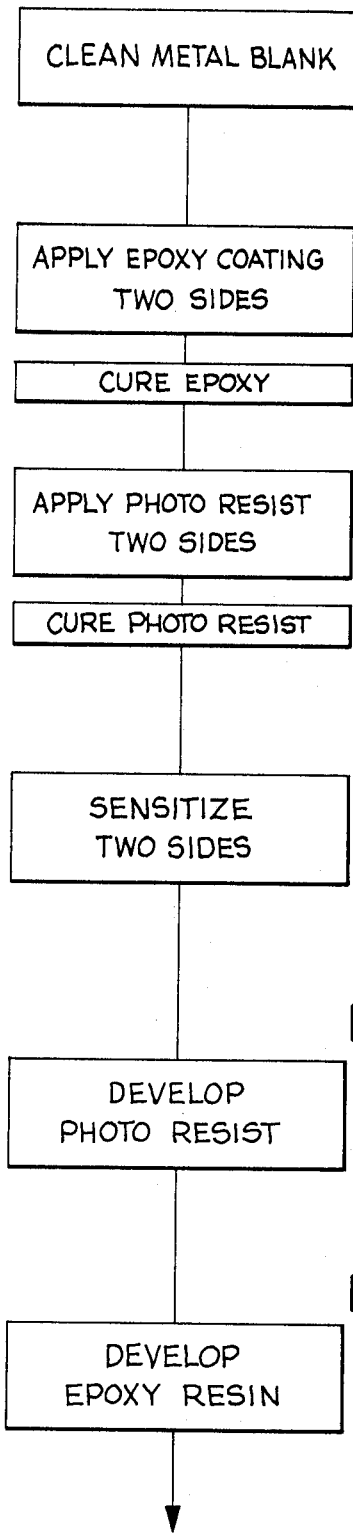

In FIG. 6, the coated metal 21 is exposed to a solution which dissolves the epoxy resin 22 exposed at the base of the holes 26 in the photoresist. This operation forms an important part of this invention. It has been found that when a photoresist is exposed to a solution of 83 to 98% (93% preferred) sulfuric acid for a period of about ½ min. to 5 min. at a temperature of between about 60° F. to 120° (and preferably at room temperature), the photoresist will not be materially affected, but the epoxy resin will be completely removed, thereby creating a pattern in a protective dual coating on the metallic substrate that will withstand a very active acid etching composition such as the aqua-regia-fluoride etchant earlier described for a given short period of time.

FIG. 11 represents a section through the coated metal showing the photoresist and the epoxy resin coatings removed in holes 26 and 27, to expose the surface of metal 21.

Thereafter, the coated metal substrate 21 is chemically etched, by an acid etchant, such as is described on page 6 of this specification, at a temperature of between about 140°–180° F. for a time period equal to breakthrough in time + 10%. The etch rate varies from between ¼–½ mil./min. and the etch time will thus vary considerably depending on the thickness of the metal 21. Typically, metal thicknesses of between about 0.2–5 mils. may be through-hole etched in this manner and time periods of etch of up to 45 minutes may be tolerated by the resin layer. Under these conditions, the resin layer will not be materially affected yet the etching solution will dissolve the metal and penetrate sufficiently to produce hole 28, as shown in FIG. 7.

FIG. 8 represents the final metal sheet 21 which is perforated by holes 28. The resists 22 and 23 may be removed manually or by exposure for a period of 15 minutes or more to a solution of concentrated sulfuric acid.

In addition to the alloys heretofore set forth, other common metals to which this process is applicable are the following refractory metals and alloys: Tungsten, Molybdenum, Tantalum, and Titanium alloys. It is to be noted, also, that the process may be applicable to other metals and alloys, the novelty of the process residing not in the specific metal or alloy to be etched, but in the unique method of producing a pattern in the metal or alloy.

The polymerizable resin compositions employable in the process of this invention embrace a wide variety of compositions, e.g., epoxy resin systems, polyester resin system and polyurethane systems. Examples of the detailed compositions for each of these systems are found in 1976–77 *Modern Plastics Encyclopedia*, published by McGraw-Hill, New York, New York which is incorporated herein by this reference.

These resin compositions must be chemically resistant to the aqua regia based etchant at least under the conditions of operation herein defined but are reactive with or dissolvable by concentrated sulfuric acid.

The photo resist materials, on the other hand, may be reactive with or dissolved by the aqua regia based etchant but are not dissolved by, or reactive with, the concentrated sulfuric acid which removes the resin material of the resin layer.

This dual protective layer combining light sensitive and a protective resin materials each of which is independently removable, in a stepwise fashion, by different solvents or reactants is a major aspect of this invention.

A specific example of my invention follows:

1. The selected material, 0.016" Inco 617, is cut to a size of 10"×12", and solvent cleaned.
2. The material is powder blasted (light sand blast) to give a matte finish without distortion of metal.
3. The material is dip coated in 3M's 2290 epoxy resin which has been thinned 1:1 with methyl ethyl ketone (MEK).
4. Air dry the coated material until clear.
5. Cure the coating by heating for 45 min. at 350° F. in a circulating air oven.
6. Repeat Steps 3, 4 and 5 (reverse ends before second dip).
7. (a) Dip coat the coated material in Dynachem CMR 5000 photoresist at 60 sec. viscosity, #1 Zahn cup.
  (b) Allow to dry, tack free, between coats.
8. Bake the coated material one hour at 250° F.
9. Print 10 min. with appropriate photomask or working negative, in Millington Printer, Model YE-E214.
10. Develop photoresist 15–30 sec. in 1:1 Xylene-Stoddard solvent mixture, to obtain desired pattern in photoresist layer.
11. Bake the material 15 min. at 150° F.
12. Develop pattern in the epoxy resin by immersion 1–2 minutes in 93% $H_2SO_4$ at 80° F.
13. Etch to blueprint tolerances by immersion in Aqua-regia-HF solution as set forth on page 6 hereof, at 160° F. with concentrate adjusted to give a 0.00033"/minute etch rate.
14. Strip the resist layer from the finished part by immersion in perchlorethylene for 10–15 min, at 180° F.
15. Strip the epoxy resin layer by immersion in 93% sulfuric, 1–2 minutes, at room temperature.
16. Clean the etched metal surface with pumice (Ajax, Comet, etc.) and air dry.

Modifications will occur to those skilled in the art, without departing from the essence of this invention.

Hence, I intend to be bound only by the claims which follow.

I claim:

1. A process for the chemical milling, to a predetermined pattern, of high temperature resistant metal material including those selected from the group consisting of high temperature resistant alloys including combination alloys of two or more of chromium, nickel, molybdenum, cobalt, iron, Niobium, Titanium and Tungsten, and refractory elements which comprises:

coating the exposed surfaces of said metal material with a polymerizable resin composition;

curing said polymerizable resin composition to form a coated metal material that is coated with a layer of cured resin material;

applying a coating of light sensitive photoresist composition upon said coated metal material;

exposing said light-sensitive photoresist composition to a light source in said predetermined pattern;

chemically removing only said photoresist composition in accordance with said predetermined pattern to thereby expose cured resin material in those same areas where said photoresist material has been removed;

chemically removing only said exposed cured resin material without removal of metal or photoresist material to thereby expose metal material in those same areas where said photoresist and resin materials have been previously removed;

chemically etching said exposed metal material in the said predetermined pattern with an etchant selected from the group consisting predominately of aqua regia and aqua regia plus hydrofluoric acid at temperatures of between about 140° F. to 180° F. but without removal of cured resin material by said etchant; and stripping said photoresist composition and cured resin material to completely expose said metal material etched in said predetermined pattern.

2. The process of claim 1 wherein said photoresist composition is an organic polymerizable system containing solvent and said solvent is removed and said system cured prior to exposure of said photoresist composition to a light source.

3. The process of claim 1 wherein said polymerizable resin composition is selected from the group consisting of epoxy resin compositions, polyester resin compositions and polyurethane resin compositions.

4. The process of claim 1 wherein said polymerizable resin composition has a thickness of between about 1.5 and 10 milliinches.

5. The process of claim 1 wherein said light-sensitive photoresist composition is an organic resin composition polymerizable in the presence of an ultraviolet source of light.

6. The process of claim 1 wherein said exposed cured resin material is chemically removed by reaction with sulphuric acid having a concentration of between about 83% and 98%, for a period of between 30 seconds and five (5) minutes depending upon the concentration, and at a temperature of between about 60° F. and 120° F.

7. The process of claim 1 wherein said exposed metal material in the said predetermined pattern, is chemically etched at a temperature of between 140° F. and 160° F. without removing any material of said cured resin layer, by means of an etchant having the following composition:

32° Baume Muriatic Acid: 9 Gal.

40° Baume Nitric Acid: 1 Gal. 70° Hydrofluoric Acid: 0.2 Gal.

Anhydrous $FeCl_3$ to specific gravity: 1.26.

8. The process of claim 1 wherein said photoresist composition is polymerizable and is first cured prior to exposure to a light source.

* * * * *